United States Patent [19]

Moen, Jr.

[11] Patent Number: 5,146,617
[45] Date of Patent: Sep. 8, 1992

[54] HARMONIC NOISE MINIMIZATION IN A RADIO RECEIVER BY SELECTIVELY OPTIMIZING IC'S WHICH PRODUCE HARMONICS IN THE RADIO'S FREQUENCY RANGE

[75] Inventor: Russell R. Moen, Jr., Tigard, Oreg.

[73] Assignees: Seiko Corp., Japan; Seiko Epson Corp., Japan

[21] Appl. No.: 597,834

[22] Filed: Oct. 15, 1990

[51] Int. Cl.$^5$ .......................... H03K 6/04; H04B 1/10
[52] U.S. Cl. ...................................... 455/310; 307/263
[58] Field of Search ............... 455/295, 296, 298, 300, 455/308–312, 343; 307/263, 491, 542, 572; 340/825.44; 375/99

[56] References Cited

U.S. PATENT DOCUMENTS

| | | | |
|---|---|---|---|
| 4,644,250 | 2/1987 | Hartgring | 323/225 |
| 4,713,808 | 12/1987 | Gaskill et al. | 370/94.1 |
| 4,947,063 | 8/1990 | O'Shaughnessy et al. | 307/572 |
| 5,012,131 | 4/1991 | Maben et al. | 307/296.4 |

Primary Examiner—Reinhard J. Eisenzopf
Assistant Examiner—Chi H. Pham
Attorney, Agent, or Firm—Elmer Galbi

[57] ABSTRACT

An electronic circuit, such as the type which may be found in a watch pager receiver, which contains both analog and digital circuitry, includes harmonic noise minimization circuitry. The minimization circuitry is constructed using standard cell designs which are optimized for particular clock operations. Select circuit components are optimized to produce minimal harmonics, to operate at the predetermined frequency and include resistance means to provide an output of a second known level which is characterized by an optimized output signal having a ramped wave configuration. The optimized output signal is of adequate strength to provide an input to a downstream component.

4 Claims, 4 Drawing Sheets

HARMONIC NOISE MINIMIZATION IN A RADIO RECEIVER BY SELECTIVELY OPTIMIZING IC'S WHICH PRODUCE HARMONICS IN THE RADIO'S FREQUENCY RANGE

The present invention is related to radio receivers, and more particularly to a circuit within a radio receiver which minimizes interference caused by digital circuitry in the radio receiver.

BACKGROUND OF THE INVENTION

A number of devices are known which incorporate radio receivers, which are at least partially analog in nature, and which also incorporate digital circuitry. One such device is the receiver of a watch pager system which is described in U.S. Pat. No. 4,713,808, Dec. 15, 1987, to Gaskill et al. Digital circuitry in such a device may operate at a known frequency, and generally includes more than one clock, for timing various portions of the circuitry. The radio receiver may operate in a known frequency range, such as the commercial FM band used in the United States, which operates between 88 MHz and 108 MHz.

In the case of the watch pager system described in the '808 reference, communication signals are transmitted from conventional FM broadcasting facilities on FM side bands and are received by the watch receiver. The receiver may operate at a frequency in the high 80's or low 90 MHz range. The digital portion of the receiver may operate at a nominal frequency of 10 MHz. Such digital circuitry usually radiates harmonics at 80 and 90 MHz, which interferes with the receiver function.

RF interference, or crosstalk, between analog and digital signals is common in large scale integrated circuits wherein analog/digital applications are both present and are distributed in the system. Particularly in cases where analog and digital portions of the circuit are in close proximity to one another, and wherein the digital signals radiate at harmonic-producing frequencies, the harmonics may significantly impact the quality of the analog signal which is received by the receiver and degrade the resultant receiver function.

Shielding is one technique which may be used in an attempt to prevent the digital origin harmonics from interfering with the analog radio receiver. Shielding requires that the digital portion of the circuitry be encapsulated, or "boxed-off", in an attempt to prevent the harmonics emanating from the digital circuitry interfering with the analog portion of the receiver.

A modified form of shielding provides a top cover, which merely extends over the top of the digital portion of the circuitry. Another type of shielding is a full encapsulation of the digital circuitry, completely enclosing it within a shield. In devices such as the wristwatch pager receiver described in the '808 reference, such shielding is not practical for at least two reasons. First, complete encapsulation of the digital circuitry is not practical because of the small size of the circuit. Second, in the case of long connector runs, wherein the digital portion of the circuit may actually leave an integrated circuit and traverse a circuit board, shielding is extremely difficult, if not impossible.

Another interference avoiding technique requires shifting the frequency of the clocks that drive the digital circuitry each time the radio receiver is tuned to a new frequency so that the harmonics generated by the digital circuitry do not fall within the receiver's band of interest. The preceding technique requires additional circuitry which senses the frequency of the initial signal reaching the receiver and operates to shift the frequency of the digital circuit to avoid generating an interfering signal. This technique again requires additional circuitry and hence, additional space and cost.

Another technique for reducing the generation of harmonic interference is to operate an integrated circuit containing the digital circuitry at a low voltage, for instance, from 1 to 1.5 V instead of the normal 5 volt integrated circuit operating voltage. In order to operate an integrated circuit at the lower voltages, an application specific integrated (ASIC) must be designed. Such a circuit may be a totally custom-design IC, wherein each device in the circuit is individually designed to meet the requirements for the particular device. Such a circuit generally achieves a higher performance standard, using lower power and has a smaller die size, however, such custom designs require a great deal of design time and increase the chance that errors in circuit design will occur.

An ASIC may also be designed using a standard cell library, wherein the various devices in the circuit are chosen from a set of alternatives available in a standard cell library. Such ICs may be designed more quickly and with less probability of error, however, the speed, power and die size of such ICs are generally not optimized. In some situations, standard cells may be used for parts of the circuitry and custom designs may be used for other parts where performance is critical.

An IC may be designed such that the digital circuits which operate at frequencies having harmonics within the receiver's band of interest have a width-to-length (W/L) ratio as low as possible. Low W/L ratio circuits operate at minimal currents and have pulses which are substantially rounded in nature, which generate relatively few harmonics. However, such a fully custom integrated circuit is an exceptionally expensive and time consuming to design.

SUMMARY OF THE INVENTION

The invention is an electronic circuit, such as the type which may be found in a watch pager receiver, which contains both analog and digital circuitry, which is initially designed and constructed using standard cell library devices or components, and which has harmonic noise minimization circuitry. The minimization circuitry includes at least one clock which provides a clock output for timing circuit functions which operate at a known, harmonic-producing frequency. Plural, digital circuit components which operate at the predetermined frequency are connected to a power supply which supplies a known voltage to the circuit components. This results in a component output of a first known level, which is characterized by a substantially square wave signal. The square wave signal is of more than adequate strength to provide an input to a downstream component. The circuit components are optimized to produce minimal harmonics, to operate at the predetermined frequency and include resistance means to provide an output of a second known level which is characterized by an optimized output signal having a ramped wave configuration. The optimized output signal is of adequate strength to provide an input to a downstream component.

The circuit may be constructed using standard cells which may operate at low, medium and high power. Although such cells are not absolutely optimized, the construction does result in a minimal amount of harmonic noise generation.

The digital circuitry is designed primarily using standard cells except for those parts of the integrated circuit which operate at a clock, or synchronization, frequency that is known to radiate harmonics into the radio receiver's frequency band. Such components are optimized using a custom design to minimize the radiation of signals into the receivers frequency band.

These and other advantages of the invention will become more fully apparent as the description which follows is read in conjunction with the drawings.

DETAILED DESCRIPTION OF THE PREFERRED EMBODIMENT

Figure 1:
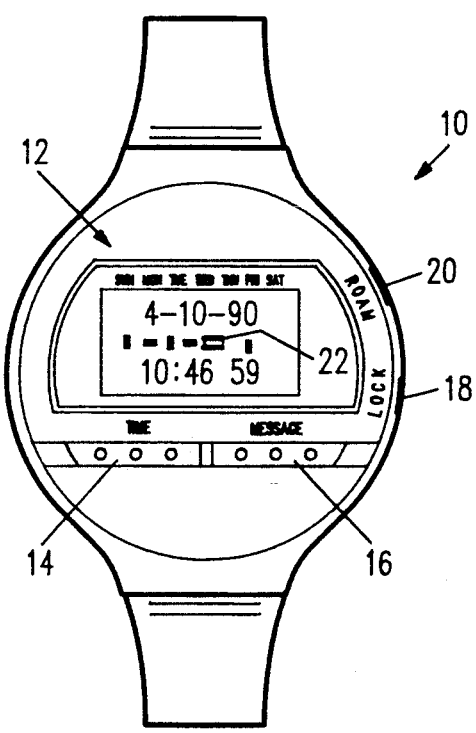
FIG. 1 is a top plan view of a wristwatch receiver.

Turning initially to FIG. 1, a wristwatch paging receiver is depicted generally at 10. The circuitry contained in watch 10, and the transmission circuitry used to transmit a signal to watch 10 are described in U.S. Pat. No. 4,713,808, Dec. 15, 1987, to Gaskill et al., which is incorporated herein by reference.

Watch 10 includes a display face 12, control keys for time, 14, message, 16, lock, 18, and roam 20. As depicted, display 12 indicates the date as Apr. 10, 1990 and the time as 10:46:59. The presence of the envelope icon 22 indicates that a message has been received by the receiver and is stored until such time as the user depresses the proper keys to retrieve the message.

Figure 2:
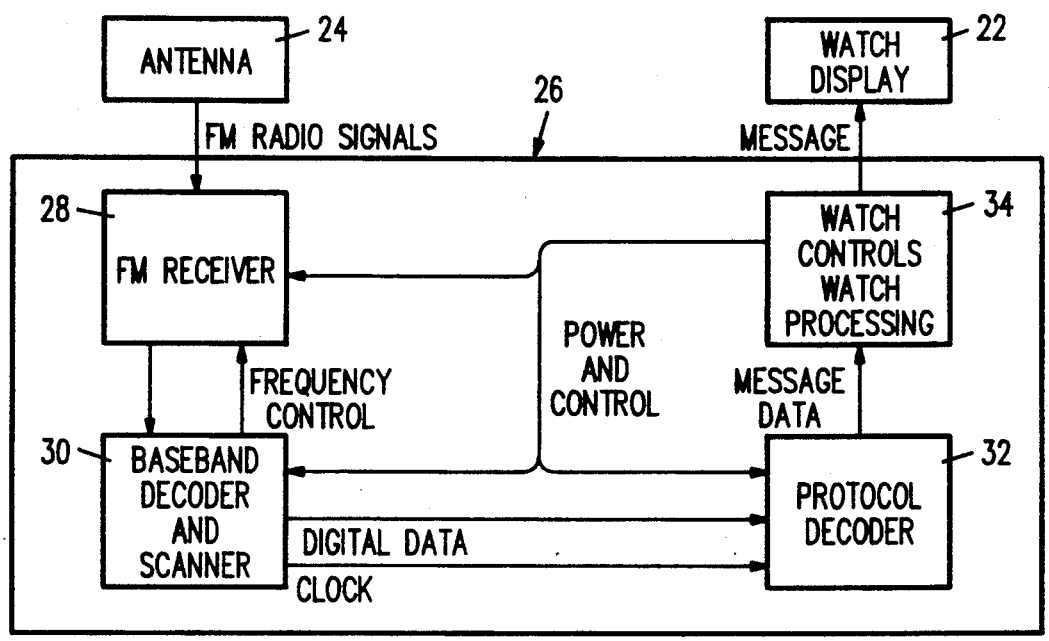
FIG. 2 is a block diagram of the receiver of FIG. 1.

Turning now to FIG. 2, a block diagram for watch 10 is depicted. In addition to display 12, watch 10 includes an antenna 24, which is generally located in the wristband. The receiver/decoder 26 includes an FM receiver 28 which receives FM signals through antenna 24. Receiver 28 is predominately an analog device. A baseband decoder and scanner 30 receives signals from receiver 28 and provides frequency control for the receiver. The circuitry used in watch 10 is designed using stand and cell library designs, some of which are optimized to provide the harmonic noise minimization circuitry.

A protocol decoder 32 decodes message date and passes such data to the watch control and watch processing subsystem 34. Decoder 32 and control processing subsystem 34 are predominately digital in nature and include a number of clock, or synchronization, mechanisms which provide timing control for the receiver. FM receiver 28 and baseband decoder 30 are affected by harmonic noise which is generated by the control processing subsystem and the protocol decoder.

Receiver 28 comprises a bipolar integrated circuit which provides a miniaturized FM subchannel/scanner which is capable of operating in the 88 to 108 MHz frequency range. As this range is the standard for commercial FM broadcasting in many countries, watch 10 is able to receive messages in such countries over normal FM broadcast bands. Receiver 28 generates a composite signal in the range of zero to 100 kHz which includes the audio band, a 19 kHz serial pilot carrier and a sub-carrier band above 53 kHz.

In the preferred embodiment of watch 10, block 30 is a high speed MOS integrated circuit which contains a base band decoder, which performs the function of abstracting the data and clock from the audio signal generated by receiver 28, and a frequency controller or scanner for receiver 28. The clock is derived from the 19 kHz pilot carrier of the received FM signal and is extracted from the audio output of receiver 30 by means of a phase-lock loop. Both the FM receiver and the base band decoder functions require power-up initialization from watch 10's controller/processor subsystem 34. Receiver decoder 26 also includes a power supply in subsystem 34 which supplies power at a known voltage and current to the circuit components.

Figure 3:
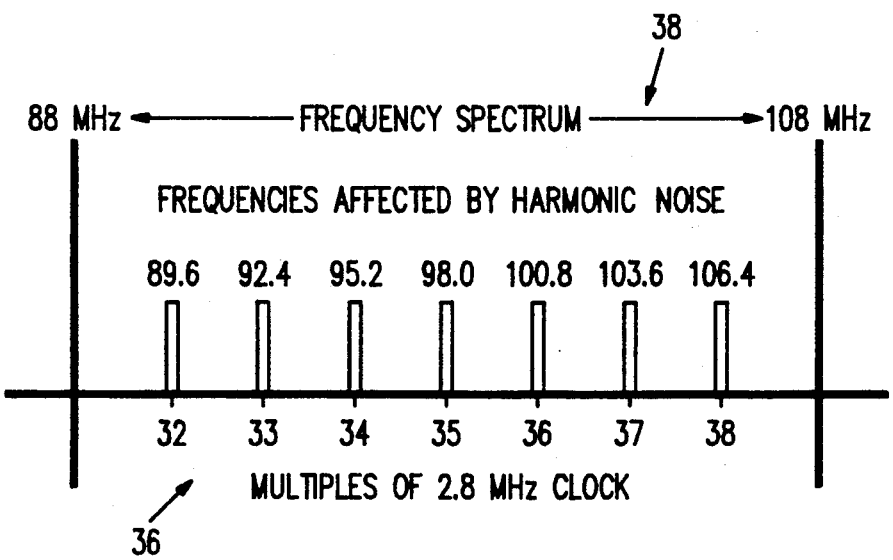
FIG. 3 depicts a representative set of harmonic frequencies generated by a 2.8 MHz clock.

One of the clocks which is used in receiver decoder 30 operates at 2.8 MHz, which is a standard controller for integrated circuits. Referring to FIG. 3, multiples 32-38 of a 2.8 MHz clock are depicted generally at 36. The FM band, 88 to 108 MHz is depicted generally at 38. It is readily apparent that harmonic noise will affect FM reception when the FM broadcast signal is specific frequencies such as 89.6, 92.4, etc. The 2.8 MHz clock operates at what is referred to herein as a harmonic-producing frequency.

Figure 4:
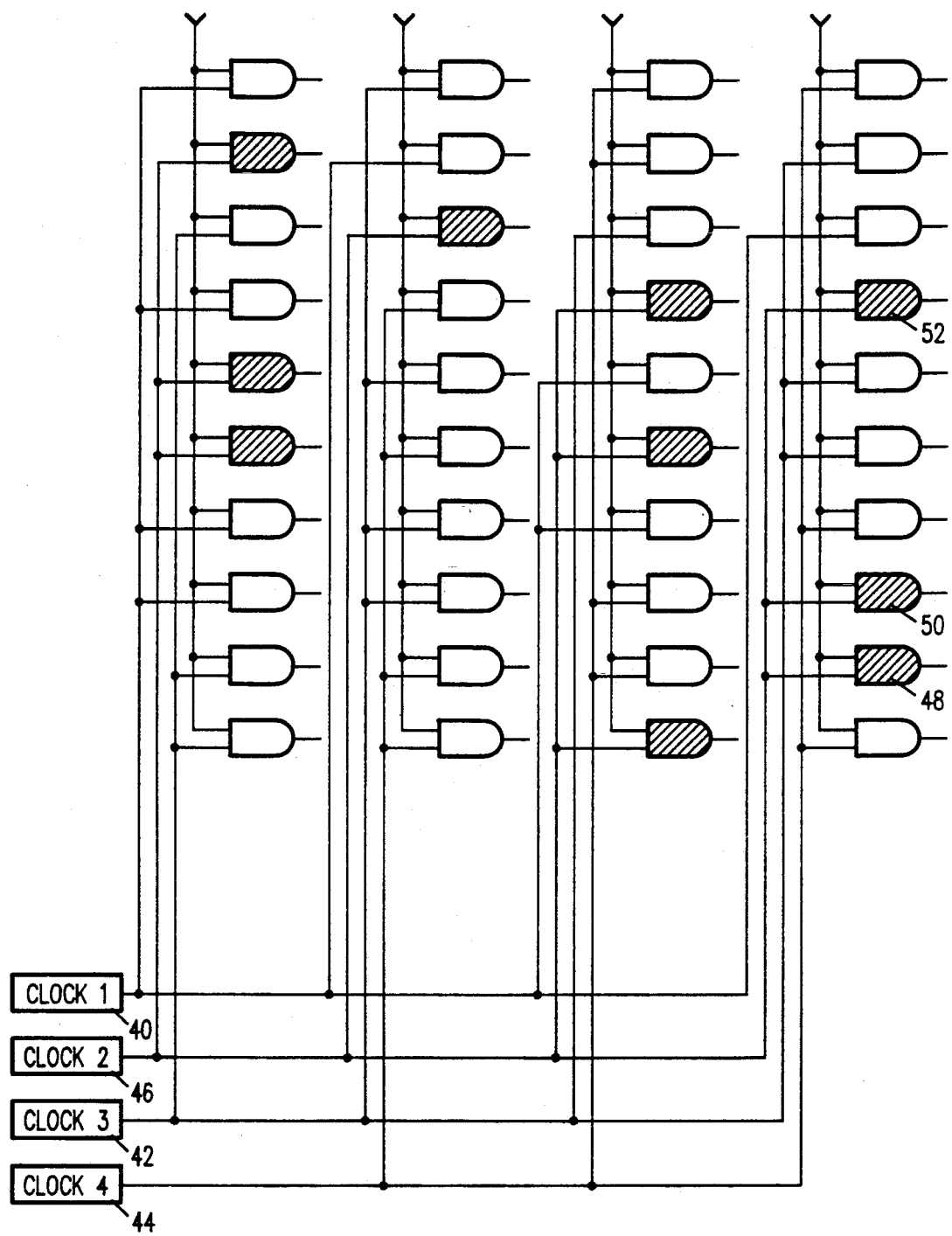
FIG. 4 is a somewhat schematic representation of a portion of the circuitry illustrating how various cells are connected to the clock mechanism of the circuit.

It should be appreciated, and now turning to FIG. 4, that there are a number of clocks in the circuitry of the wristwatch receiver. Not all of the clocks will produce harmonics which interfere with FM reception. As depicted in FIG. 4, clocks 40, 42 and 44, designated clocks 1, 3 and 4 respectively, operate at frequencies which, while they may produce harmonic interference, do not produce harmonic interference at frequencies which are common with the FM broadcast band. These clocks are connected to an array of plural, digital circuit devices within the electronic circuit which do not need to be optimized to reduce harmonic interference.

Clock 2, 46, is also connected to an array of plural, digital circuit components, such as devices 48, 50 and 52, which are indicated by hatching, and which operate at the 2.8 MHz frequency of clock 2. Clock 2, operating at 2.8 MHz, produces harmonics which are in the frequency of interest, i.e., the FM broadcast band. Initially, an electronic circuit may be designed with completely random arrangement of the components in order to most efficiently use the available space. Suitable connections are made between the various devices, which connection include connection to a clock. Those devices which are connected to clock 2 are optimized to reduce the transients or harmonics. One way of accomplishing such optimization is to construct the devices so that they use less current and voltage. Any of the other standard cells which are not driven by the 2.8 MHz clock are not modified. The minimization circuit may therefore be thought of as including a selective optimization mechanism. In order to optimize those devices which may generate interfering harmonics, those devices which are driven by the 2.8 MHz clock are identified and are then modified.

Figure 5:
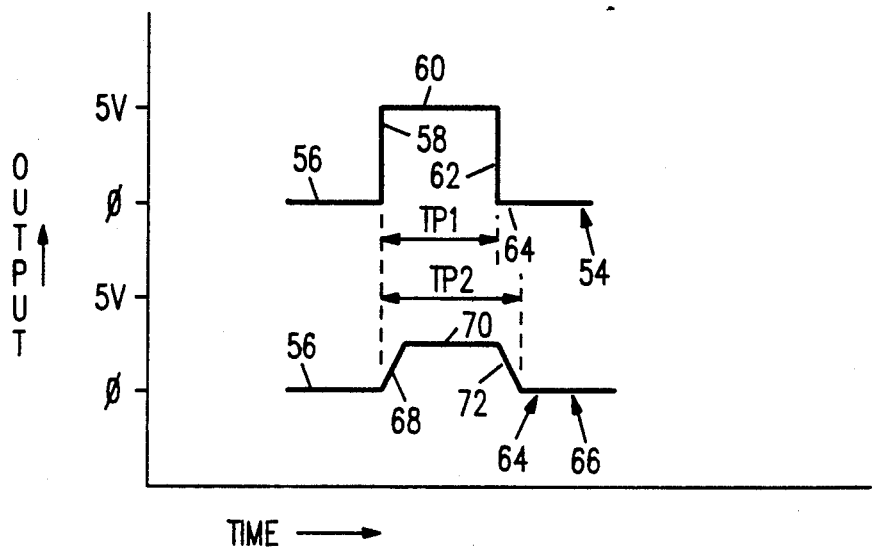
FIG. 5 depicts a comparison of a normal and optimized digital pulse generated by the harmonic noise minimization circuitry.

Turning to FIG. 5, the output of a conventional, standard cell devices, in this case a CMOS transistor, is depicted at 54. The output, of a first known level, is characterized by a substantially square wave, which initially has a zero output 56, a near vertical rise 58, a steady state output 60, a near vertical decent 62, which is followed by a zero output 64. In particular, a device, such as device 48 is particularly adept at producing a harmonic interference during rise 58 and fall 62. During these events, capacitance or inductive coupling may occur between the power supply lines and traces which go to other devices.

It should be appreciated that although standard cell library devices are suitable for most applications, they generally provide more than adequate performance, providing a stronger output than is required and operating at speeds which are in excess of that which is generally required for any given application. In particular, the fast edge rates depicted at 58 and 62 in FIG. 5 generate a significant level of interference-producing harmonics. By slowing the edge rate, the energy use of a particular device is spread over time, which reduces the harmonics.

An optimized output is depicted in FIG. 5 at 66 which begins with a zero output 56, a slow-edge rate, or ramped, rise 68, a steady state output 70 of a second known level, a slow-edge rate fall 72 and a zero output 64. In the preferred embodiment, any device which operates at 2.8 MHz, the clock frequency most responsible for producing interfering harmonics, is selectively powered down to the point where the output vectors are acceptable, thereby providing an adequate strength output to provide an adequate input to a downstream component, but which operate at minimum values. Such powering down is accomplished by selectively optimizing the performance of the CMOS gates associated with devices operating at 2.8 MHz. Although this may result in changing the structure of 25% to 50% of the standard cell devices on an integrated circuited, such selective optimization is considerably less expensive and time consuming than ASIC construction and more effective than shielding.

Figure 6:
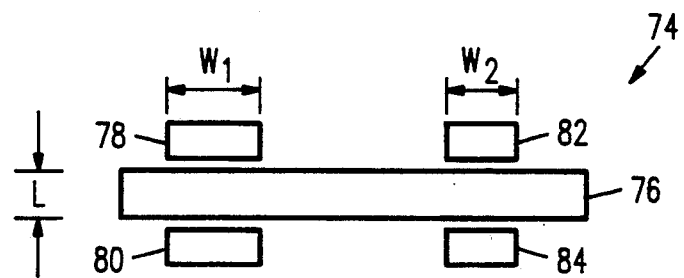
FIG. 6 is a schematic representation of a CMOS transistor illustrating side-by-side, a standard cell library transistor and a harmonic noise minimized transistor.

One way of accomplishing such optimization is to optimize the performance of the gates for specific applications, such as a transistor, wherein the standard parts, which are generally better than needed, are intentionally degraded, generally by slowing them down, to reduce the harmonics in the frequency of interest. As indicated at FIG. 5, the length of time for the rise and steady state operation of both outputs 54 and 66 is identical. The difference being in the time TP1 versus TP2 and the amplitude of the steady state output. This is accomplished by changing the width to length ratio of the gate as it is constructed on a CMOS substrate. Such a construction is schematically represented in FIG. 6. A portion of a CMOS device is shown generally at 74. The device includes a gate 76 having a length L. On the left side of the figure, or source, 78 having a width $W_1$ is coupled with a collector, or drain, 80, also having a width $W_1$. Source 78 and drain 80, when connected by gate 76 will produce an output wave such as that depicted at 54 in FIG. 5, and will also, if driven by a 2.8 MHz clock, produce an unacceptable amount of harmonic interference.

The configuration depicted on the right side of FIG. 6 depicts an emitter 82 having a with $W_2$ which is connected across gate 76 to a collector 84, also having a width $W_2$. As used herein, $W_1$ is less than $W_2$. When emitter 82 and collector 84 are connected by gate 76, the speed with which the connection is made and the current flow is reduced by the decrease in the relative width of the emitter and collector and produces an output wave such as depicted at 66 in FIG. 5. The decrease in the relative width of the source and drain takes advantage of the relationship between W, L and the resistance in that W/L is proportional to 1/R.

By decreasing the width of the source and drain, the resistance across the device is increased, causing the device to react more slowly than it would with conventional size components. The slower response time does not affect the operation of the digital portion of the receiver while actually upgrading the performance of the analog portion of the receiver in that the harmonics are no longer a problem.

Although the preferred embodiment of the invention and method have been disclosed herein, it should be appreciated that variation and modifications may be made thereto without departing from the scope of the invention as defined in the appended claims.

What I claim is:

1. An electronic circuit having harmonic noise minimization circuitry and downstream circuits which require signals of a first signal level comprising:

at least one clock providing a clock output for timing circuit functions which operates at a known, harmonic-producing predetermined frequency;

a first plurality of digital circuit components having outputs connected to said downstream circuits, and which operate at a frequency other than said predetermined frequency, a second plurality of digital circuit components also having outputs connected to said downstream circuits, and which operate at said predetermined frequency, and a power supply which supplies a first supply voltage to said first plurality of digital circuit components, which results in a component output of a first signal level characterized by a substantially square wave signal, which signal is more than the magnitude of said first signal level required by said downstream circuits, means providing said first supply voltage to said second plurality of digital circuit components, said second plurality of digital circuits being designed to produce minimal harmonics, to operate at said predetermined frequency and said second plurality of digital circuits including resistance means to provide an output of a second signal level characterized by an output signal having a ramped wave configuration, which output signal has a magnitude not greater than said first signal level required by said downstream circuits.

2. The minimization circuitry of claim 1 wherein said resistance means includes a gate in a CMOS device of reduced width to reduce said first supply voltage input whereby the output of said second plurality of circuits is reduced.

3. A digital electronic circuit as part of a radio/pager receiver, electronic signals at certain interfering frequencies interfering with the operation of said radio/pager receiver, said digital electronic circuit having harmonic noise minimization circuitry comprising:

a plurality of clock mechanisms in a digital circuit, at least one of said clock mechanisms operating at a frequency which generates harmonic signals which normally interfere with the operation of the radio receiver, a power supply which supplies a known voltage to said electronic circuit, an array of digital electronic devices coupled to said plurality of clock mechanisms, said array having devices of a first design and devices of a second design, said devices of said first design being standard devices, said devices of said second design being driven by said at least one clock mechanism which operates at an interfering frequency, said devices of said second design being modified to operate at a voltage and current less than said known voltage and current.

4. The circuit of claim 3 wherein said devices of a second design include resistance means having a gate in a CMOS device of reduced width to reduce the voltage output of said devices of a second design.

* * * * *